(12) United States Patent
Lee et al.

(10) Patent No.: US 9,871,090 B2
(45) Date of Patent: Jan. 16, 2018

(54) ORGANIC LIGHT EMITTING DISPLAY

(71) Applicant: SAMSUNG DISPLAY CO., LTD., Yongin-si, Gyeonggi-do (KR)

(72) Inventors: Seho Lee, Cheonan-si (KR); Taehyung Kim, Seoul (KR); Je-hyun Song, Seoul (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/180,109

(22) Filed: Jun. 13, 2016

(65) Prior Publication Data

US 2017/0110530 A1 Apr. 20, 2017

(30) Foreign Application Priority Data

Oct. 15, 2015 (KR) .......................... 10-2015-0144138

(51) Int. Cl.
*H01L 27/32* (2006.01)
*H01L 51/52* (2006.01)

(52) U.S. Cl.
CPC ...... *H01L 27/3276* (2013.01); *H01L 27/3248* (2013.01); *H01L 27/3253* (2013.01); *H01L 27/3258* (2013.01); *H01L 51/5228* (2013.01); *H01L 51/5234* (2013.01); *H01L 2251/5315* (2013.01)

(58) Field of Classification Search
CPC . H01L 27/32; H01L 27/3276; H01L 27/3248; H01L 27/3253; H01L 27/3258
See application file for complete search history.

(56) References Cited

U.S. PATENT DOCUMENTS

| 8,872,179 | B2* | 10/2014 | Tsubuku ........... H01L 29/78693 257/43 |
| 2010/0072482 | A1* | 3/2010 | Eom .................. H01L 27/3276 257/72 |
| 2014/0374732 | A1 | 12/2014 | Jeong et al. |
| 2016/0254334 | A1* | 9/2016 | Yang .................. H01L 27/3262 257/40 |
| 2016/0293888 | A1* | 10/2016 | Shim .................. H01L 27/3246 |

FOREIGN PATENT DOCUMENTS

| JP | 2015-103337 A | 6/2015 |
| KR | 10-2012-0072950 A | 7/2012 |
| KR | 10-1460653 B1 | 11/2014 |
| KR | 10-2014-0141529 A | 12/2014 |
| KR | 10-2015-0054125 A | 5/2015 |

* cited by examiner

*Primary Examiner* — Phuc Dang
(74) *Attorney, Agent, or Firm* — Lee & Morse, P.C.

(57) ABSTRACT

An organic light emitting display includes a driving transistor, an organic light emitting diode, an interlayer insulating layer, and a connection electrode. The interlayer insulating layer covers the driving transistor, and first and second via holes are formed in the interlayer insulating layer. The organic light emitting diode is on the interlayer insulating layer and connected to the driving transistor. The connection electrode is on the interlayer insulating layer and connected to an auxiliary line through the second via hole. The connection electrode surrounds a portion of the interlayer insulating layer together with the auxiliary line. The organic light emitting diode includes an anode connected to the driving transistor through the first via hole, an organic light emitting layer on the anode, and a cathode on the organic light emitting layer and connected to the auxiliary line through the connection electrode.

19 Claims, 9 Drawing Sheets

ORGANIC LIGHT EMITTING DISPLAY

CROSS-REFERENCE TO RELATED APPLICATION

Korean Patent Application No. 10-2015-0144138, filed on Oct. 15, 2015, in the Korean Intellectual Property Office, and entitled: "Organic Light Emitting Display," is incorporated by reference herein in its entirety.

BACKGROUND

1. Field

One or more embodiments herein relate to an organic light emitting display.

2. Description of the Related Art

An organic light emitting display (OLED) generates an image using pixels equipped with organic light emitting diodes. Each organic light emitting diode has an organic light emitting layer between an anode and cathode.

When a source voltage signal is applied to the organic light emitting diode, holes are provided to the organic light emitting layer through the anode and electrons are provided to the organic light emitting layer through the cathode. Excitons are generated when the holes and electrons recombine in the organic light emitting layer. Light is then emitted when the excitons change from an excited state to a ground state.

SUMMARY

In accordance with one or more embodiments, an organic light emitting display comprising a first base substrate including a light emission area and a non-light emission area; a driving transistor on the first base substrate; an interlayer insulating layer covering the driving transistor; a first via hole and a second via hole in the interlayer insulating layer; an organic light emitting diode on the interlayer insulating layer and connected to the driving transistor, the organic light emitting diode at a location corresponding to the light emission area; an auxiliary line in the non-light emission area; and a connection electrode on the interlayer insulating layer and connected to the auxiliary line through the second via hole, the connection electrode surrounding a portion of the interlayer insulating layer corresponding to the non-light emission area together with the auxiliary line, the organic light emitting diode including an anode connected to the driving transistor through the first via hole, an organic light emitting layer on the anode, and a cathode on the organic light emitting layer and connected to the auxiliary line through the connection electrode.

The connection electrode and the auxiliary line may seal a portion of the interlayer insulating layer corresponding to the non-light emission area. The interlayer insulating layer may include a first insulating layer overlapping the organic light emitting diode; and a second insulating layer overlapping the auxiliary line in the non-light emission area and spaced apart from the first insulating layer, wherein the connection electrode is between the first insulating layer and the second insulating layer. The connection electrode may include a first conductive layer in the second via hole and surrounding the second insulating layer; and a second conductive layer connected to the first conductive layer and covering the first conductive layer and second insulating layer.

A size of the second conductive layer may be greater than a size of the second insulating layer. The first conductive layer may have a ring shape and the second conductive layer may have a polygonal shape. The first conductive layer may have a ring shape and the second conductive layer may have a circular shape. The first conductive layer may cover a side portion of the second insulating layer, the second conductive layer may cover an upper portion of the second insulating layer, and the auxiliary line may cover a lower portion of the second insulating layer. An opening may be defined in the organic light emitting layer corresponding to the non-light emission area, the opening overlapping the second insulating layer.

The display may include a gate insulating layer on the first base substrate; and an intermediate insulating layer between the gate insulating layer and the interlayer insulating layer. The driving transistor may include a semiconductor pattern; a gate electrode overlapping the semiconductor pattern, the gate insulating layer interposed between the gate electrode and the semiconductor pattern a source electrode on the intermediate insulating layer and connected to the semiconductor pattern; and a drain electrode on the intermediate insulating layer, connected to the semiconductor pattern, and connected to the anode through the first via hole, wherein the auxiliary line is on the intermediate insulating layer. The auxiliary line, the source electrode, and the drain electrode may include a same material. The connection electrode and the anode may include a same material.

The cathode may have a light transmissive property and the organic light emitting layer emits color light. The display may include a second base substrate facing the first base substrate and a color filter on the second base substrate and corresponding to the light emission area, wherein the organic light emitting layer emits white light.

In accordance with one or more embodiments, an organic light emitting display includes a first base substrate including a light emission area and a non-light emission area; a driving transistor on the first base substrate; an interlayer insulating layer covering the driving transistor; a first via hole and a second via hole in the interlayer insulating layer; an organic light emitting diode on the interlayer insulating layer and corresponding to the light emission area, the organic light emitting diode connected to the driving transistor; an auxiliary line in the non-light emission area; and a connection electrode on the interlayer insulating layer and connecting the organic light emitting diode to the auxiliary line through the second via hole. The interlayer insulating layer includes a first insulating layer overlapping the organic light emitting diode; and a second insulating layer overlapping the auxiliary line in the non-light emission area and having an island shape isolated from the first insulating layer.

The connection electrode may include a first conductive layer in the second via hole and surrounding the second insulating layer; and a second conductive layer connected to the first conductive layer and covering the first conductive layer and the second insulating layer. The first conductive layer, the second conductive layer, and the auxiliary line may seal the second insulating layer. The first conductive layer may cover a side portion of the second insulating layer, the second conductive layer may cover an upper portion of the second insulating layer, and the auxiliary line may cover a lower portion of the second insulating layer.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1A:
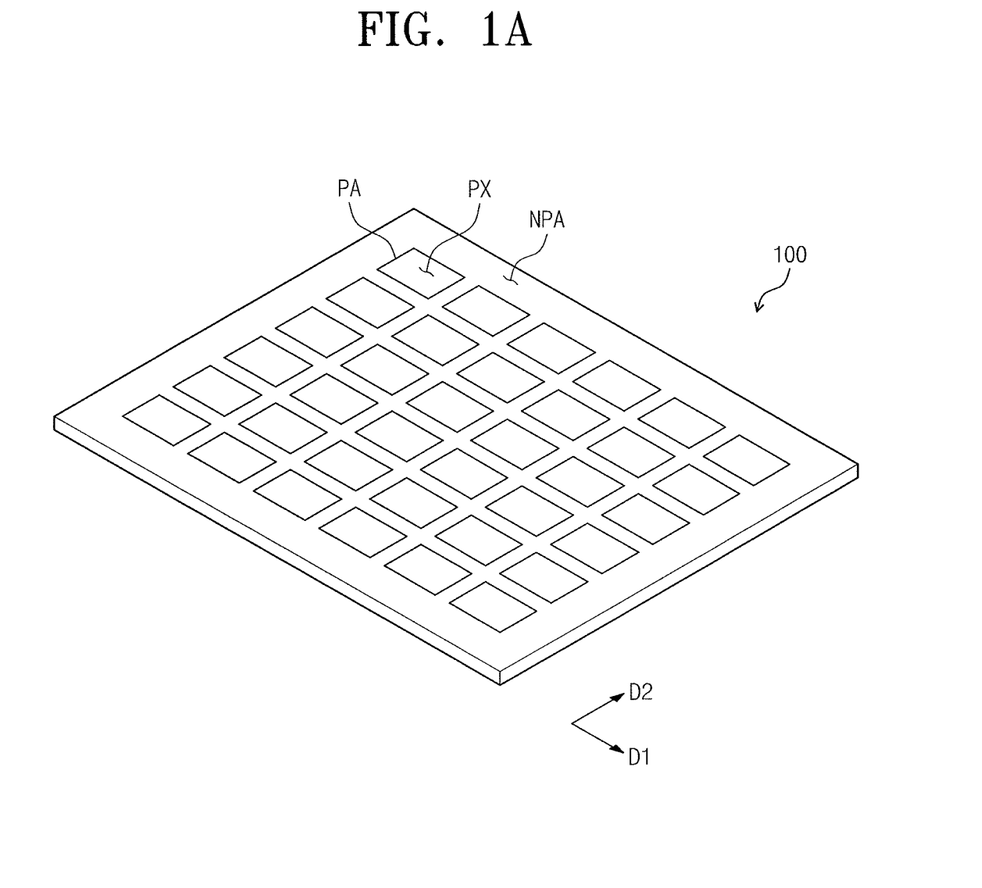
FIG. 1A illustrates an embodiment of an organic light emitting display.
Figure 1B:
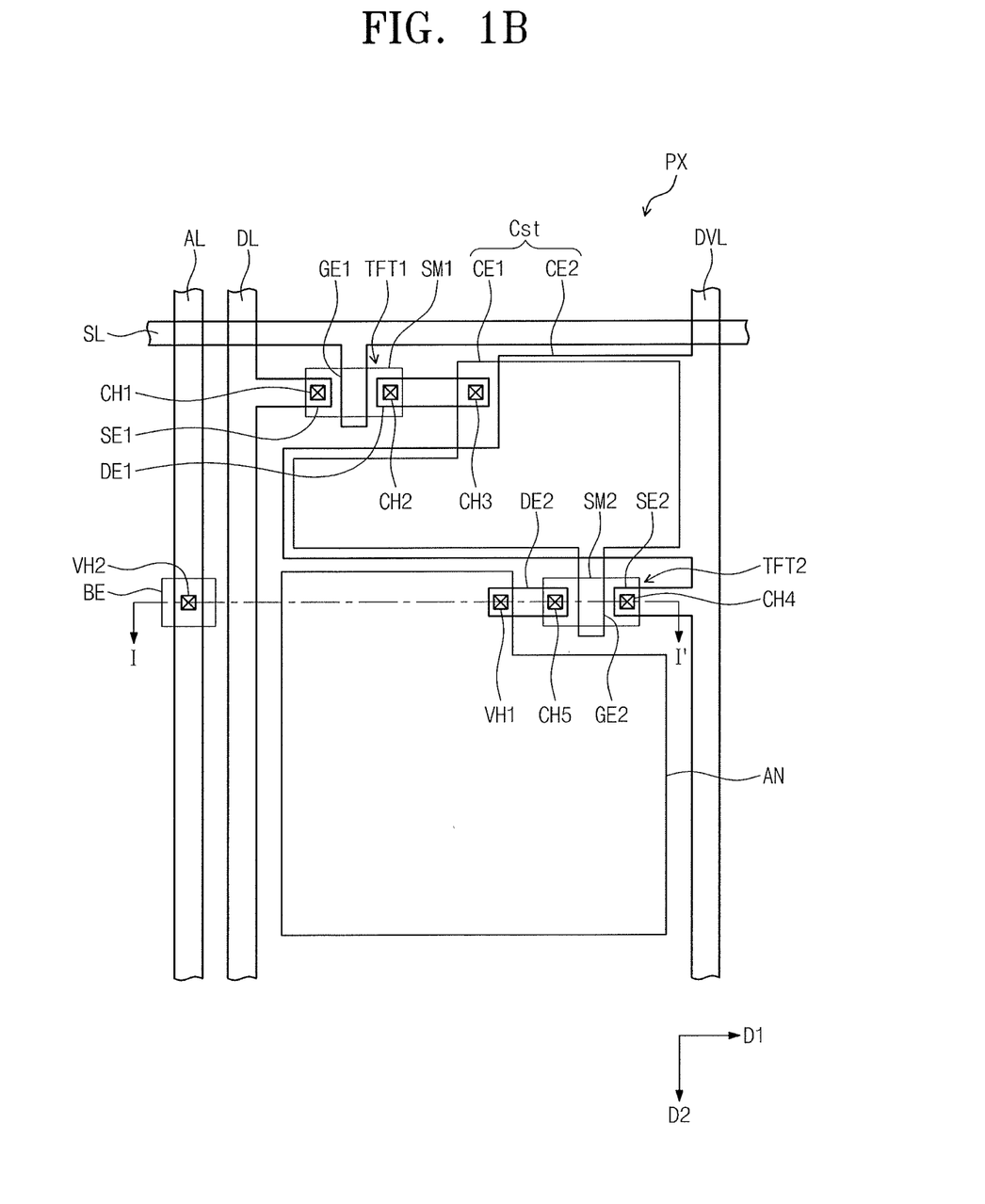
FIG. 1B illustrates an embodiment of a pixel in FIG. 1A.
Figure 2:
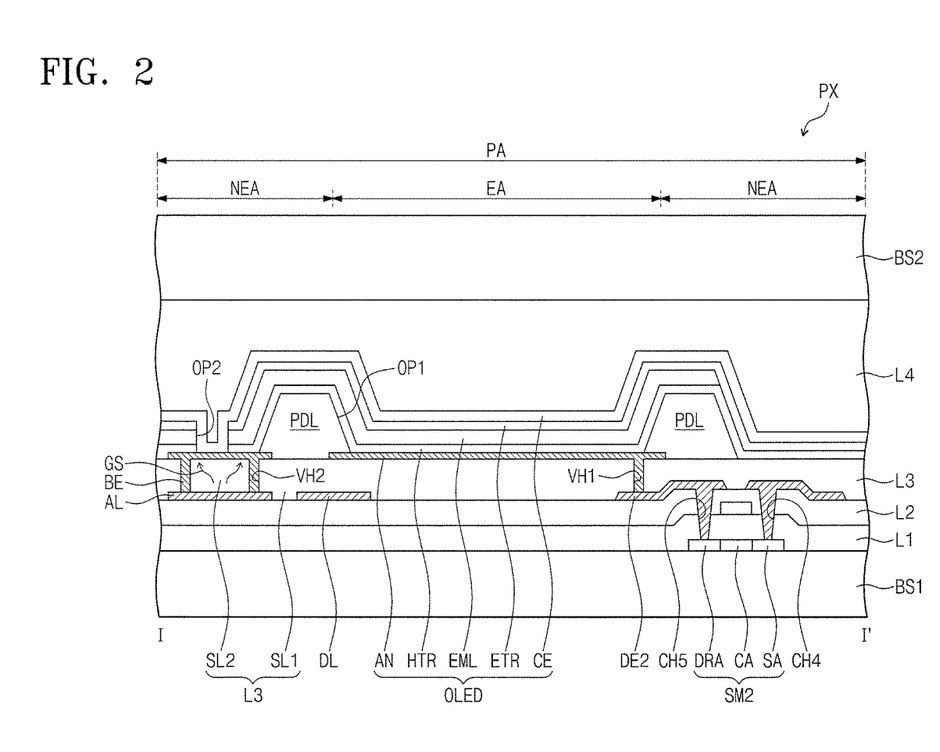
FIG. 2 illustrates a cross-sectional view taken along line I-I' in FIG. 1B.

FIG. 1A is a perspective view of one embodiment of an organic light emitting display 100, FIG. 1B is a plan view illustrating one embodiment of a pixel PX which is representative of the pixels in FIG. 1A, and FIG. 2 is a cross-sectional view taken along line I-I' in FIG. 1B.

Referring to FIGS. 1A, 1B, and 2, the organic light emitting display 100 includes a non-pixel area NPA and a plurality of pixels in a pixel area PA. Each pixel PX includes an organic light emitting diode OLED that emits light. An image is generated based on light emitted by the pixels PX. The pixels PX may have the same structure, or one or more of the pixels PX may have a different structure.

The organic light emitting display 100 includes a first base substrate BS1, a second base substrate BS2, a gate line SL, a data line DL, a driving voltage line DVL, an auxiliary line AL, a switching transistor TFT1, a driving transistor TFT2, a storage capacitor Cst, a connection electrode BE, and the organic light emitting diode OLED.

The first and second base substrates BS1 and BS2 face each other. In the present exemplary embodiment, each of the first and second base substrates BS1 and BS2 may include, for example, glass or another material. In one embodiment, each of the first and second base substrates BS1 and BS2 may include plastic or another material having flexibility.

In the present exemplary embodiment, the gate line SL is on the first base substrate BS1 and extends in a first direction D1. A gate signal is transmitted through the gate line SL. The data line DL is on the first base substrate BS1 and extends in a second direction D2 crossing the first direction D1. Data signals are transmitted through the data line DL.

The switching transistor TFT1 is electrically connected to the gate line SL and the data line DL. The switching transistor TFT1 receives the gate signal through the gate line SL and receives the data signal through the data line DL. The switching transistor TFT1 includes a first semiconductor pattern SM1, a first gate electrode GE1, a first source electrode SE1, and a first drain electrode DE1.

The first semiconductor pattern SM1 is on the first base substrate BS1 and includes a semiconductor material, e.g., polycrystalline silicon. In another embodiment, the semiconductor material in the first semiconductor pattern SM1 may include an oxide semiconductor, such as IGZO, ZnO, $SnO_2$, $In_2O_3$, $Zn_2SnO_4$, $Ge_2O_3$, and $HfO_2$, or a compound semiconductor, such as GsAs, GaP, and InP.

The first gate electrode GE1 overlaps the first semiconductor pattern SM1, and a gate insulating layer L1 is between the first gate electrode GE1 and the first semiconductor pattern SM1. The first gate electrode GE1 is electrically connected to the gate line SL, and an intermediate insulating layer L2 is on first gate electrode GE1.

The first source electrode SE1 and the first drain electrode DE1 are on the intermediate insulating layer L2 and spaced apart from each other. The first source electrode SE1 is electrically connected to the data line DL. A first contact hole CH1 and a second contact hole CH2 penetrate through the gate insulating layer L1 and the intermediate insulating layer L2. The first source electrode SE1 contacts the first semiconductor pattern SM1 through the first contact hole CH1. The first drain electrode DE1 contacts a second semiconductor pattern SM2 through the second contact hole CH2.

When the gate signal is applied to the first gate electrode GE1 through the gate line SL, the switching transistor TFT1 is turned on. Thus, the data signal applied to the first source electrode SE1 through the data line DL is provided to the storage capacitor Cst and the driving transistor TFT2.

The storage capacitor Cst is electrically connected to the switching transistor TFT1 and the driving voltage line DVL. The storage capacitor Cst is charged with an amount of electric charge corresponding to a voltage difference between the data signal from the switching transistor TFT1 and a driving signal from the driving voltage line DVL. The electric charge charged in the storage capacitor Cst is provided to driving transistor TFT2 during a turn-off period of the switching transistor TFT1.

In the present exemplary embodiment, the storage capacitor Cst includes a first storage electrode CE1 and a second storage electrode CE2. The first storage electrode CE1 is electrically connected to the first drain electrode DE1 through a third contact hole CH3. At least one of the gate insulating layer L1 or the intermediate insulating layer L2 may be between the first storage electrode CE1 and the second storage electrode CE2.

The driving transistor TFT2 is electrically connected to the switching transistor TFT1, the driving voltage line DVL, and organic light emitting diode OLED. The driving transistor TFT2 switches the driving signal from the driving voltage line DVL to the organic light emitting diode OLED.

The driving transistor TFT2 includes a second semiconductor pattern SM2, a second gate electrode GE2, a second source electrode SE2, and a second drain electrode DE2. The second semiconductor pattern SM2 may include the same material as the first semiconductor pattern SM1. The second semiconductor pattern SM2 includes a channel area CA between a source area SA and a drain area DRA. The second gate electrode GE2 is on the gate insulating layer L1 and overlaps the second semiconductor pattern SM2. The second gate electrode GE2 is electrically connected to the first drain electrode DE1. When the switching transistor TFT1 is turned on, the data signal is applied to the second gate electrode GE2 through the switching transistor TFT1 and the driving transistor TFT2 is turned on.

The second source electrode SE2 is electrically connected to the driving voltage line DVL and receives the driving signal from the driving voltage line DVL. The second source electrode SE2 is connected to the source area SA of the second semiconductor pattern SM2 through a fourth contact hole CH4. The second drain electrode DE2 is connected to the drain area DRA of the second semiconductor pattern SM2 through a fifth contact hole CH5. Thus, when the driving transistor TFT2 is turned on, the driving signal is applied to the organic light emitting diode OLED through the second source electrode SE2, the second semiconductor pattern SM2, and the second drain electrode DE2.

The auxiliary line AL extends in the second direction D2, is on the intermediate insulating layer L2, and corresponds to a non-light emission area NEA. In the present exemplary embodiment, the auxiliary line AL may be a thin film including Ag, Mg, Cu, Al, Pt, Pd, Au, Ni, Nd, Ir, Cr, Li, Ca, LiF/Ca, LiF/Al, Mo, Ti, or a compound or mixture thereof. According to another exemplary embodiment, the auxiliary line AL may include a metal oxide layer deposited on the thin film having the above-mentioned material. The metal oxide layer may include, for example, indium tin oxide (ITO), indium zinc oxide (IZO), zinc oxide (ZnO), indium tin zinc oxide (ITZO), etc.

The auxiliary line AL may have the same material and structure as the second source electrode SE2 and the second drain electrode DE2. For instance, each of the second source electrode SE2 and the second drain electrode DE2 may have a three-layer structure of molybdenum/aluminum/molybdenum. In this case, the auxiliary line AL may have the three-layer structure of molybdenum/aluminum/molybdenum.

The organic light emitting diode OLED is in a light emission area EA and emits light based on the driving signal. The organic light emitting diode OLED includes an anode AN, an organic light emitting layer EML, and a cathode CE.

The anode AN is on an interlayer insulating layer L3 covering the driving transistor TFT2, and is electrically connected to the second drain electrode DE2 through a first via hole VH1 penetrating through the interlayer insulating layer L3. In the present exemplary embodiment, the anode AN may be a reflective electrode and, for example, may include Ag, Mg, Al, Pt, Pd, Au, Ni, Nd, Ir, Cr, or a mixture thereof. In another exemplary embodiment, the anode AN may include a plurality of layers. For instance, the anode AN may have a multi-layer structure in which a metal oxide layer and a metal layer are stacked. The multi-layer structure may be a two-layer structure of ITO/Mg or ITO/MgF or a three-layer structure of ITO/Ag/ITO. In one exemplary embodiment, the anode AN and the connection electrode BE may include the same material and/or the same layer structure. For instance, each of the anode AN and the connection electrode BE may have the three-layer structure of ITO/Ag/ITO.

A pixel definition layer PDL is provided with a first opening OP1 formed therethrough and is disposed on the anode AN. The organic light emitting layer EML is on the pixel definition layer PDL and contacts the anode AN through the first opening OP1. The organic light emitting layer EML is patterned in each of the pixel areas PA to emit a colored light. As an example, when the organic light emitting layer EML in the pixel PX in FIG. 1B emits a first light, another pixel adjacent to the pixel PX may include another organic light emitting layer emitting a second light having different color from the first light.

In the present exemplary embodiment, the organic light emitting display 100 may be a top-emission-type organic light emitting display. The colored light emitted from the organic light emitting layer EML may exit after sequentially passing through the cathode CE and the second base substrate BS2. The cathode CE is on the organic light emitting layer EML.

In the present exemplary embodiment, the cathode CE may have a transmissive property or a transflective property. For instance, the cathode CE may include Ag, Mg, Cu, Al, Pt, Pd, Au, Ni, Nd, Ir, Cr, Li, Ca, LiF/Ca, LiF/Al, Mo, Ti, or a compound or mixture thereof, e.g., a mixture of Ag and Mg. The cathode CE may have a thin film shape to have the transflective property. According to another exemplary embodiment, the cathode CE may further include a transparent conductive layer, e.g., including indium tin oxide, indium zinc oxide, zinc oxide, and indium tin zinc oxide, etc., disposed on the thin film formed of the above-described material.

The cathode CE is connected to the auxiliary line AL. For example, the connection electrode BE is on the interlayer insulating layer L3 and the connection electrode BE is connected to the auxiliary line AL through a second via hole VH2, defined through the interlayer insulating layer L3. In addition, the cathode CE is connected to the connection electrode BE through a second opening OP2 defined through the organic light emitting layer EML, a hole transport region HTR, and an electron transport region ETR. Thus, the cathode CE is connected to the auxiliary line AL through the connection electrode BE. Therefore, even though the cathode CE has a thin film shape with a transflective property, an electrical resistance of the cathode CE may be reduced by the auxiliary line AL.

In the present exemplary embodiment, the organic light emitting diode OLED may include the hole transport region HTR and the electron transport region ETR. The hole transport region HTR is between the anode AN and the organic light emitting layer EML. The hole transport region HTR includes a hole injection layer and a hole transport layer, which, for example, may be formed as a single layer. The hole transport region HTR may include at least one of a hole buffer layer or an electron block layer.

The hole injection layer may include, but is not limited to, a phthalocyanine compound such as copper phthalocyanine, DNTPD (N,N'-diphenyl-N,N'-bis-[4-(phenyl-m-tolyl-amino)-phenyl]-biphenyl-4,4'-diamine), m-MTDATA(4,4', 4"-tris(3-methylphenylphenylamino) triphenylamine), TDATA(4,4'4"-Tris(N,N-diphenylamino)triphenylamine), 2TNATA(4,4',4"-tris{N,-(2-naphthyl)-N-phenylamino}-triphenylamine), PEDOT/PSS(Poly(3,4-ethylenedioxythiophene)/Poly(4-styrenesulfonate), PANI/DBSA(Polyaniline/ Dodecylbenzenesulfonic acid), PANI/CSA(Polyaniline/ Camphor sulfonicacid), PANI/PSS((Polyaniline)/Poly(4-styrenesulfonate), etc.

The hole injection layer may include an electric charge generating material to improve a conductivity of the hole transport region HTR. The electric charge generating material may be, but is not limited to, a p-type dopant. The p-type dopant may be, for example, one of a quinone derivative, a metal oxide material, or a compound containing a cyano group. In another embodiment, the p-type dopant may include the quinone derivatives, such as TCNQ(Tetracyanoquinodimethane), F4-TCNQ(2,3,5,6-tetrafluoro-tetracyanoquinodimethane), etc., or a metal oxide material such as a tungsten oxide material, a molybdenum oxide material, etc.

The hole transport layer is between the hole injection layer and the organic light emitting layer EML. The hole transport layer may include, but is not limited to, carbazole-based derivatives, e.g., n-phenyl carbazole, polyvinyl carbazole, etc., fluorine-based derivatives, triphenylamine-based derivatives, e.g., TPD(N,N-bis(3-methylphenyl)-N, N'-diphenyl-[1,1-biphenyl]-4,4'-diamine), TCTA(4,4',4"-tris (N-carbazolyl)triphenylamine), etc., NPB(N,N'-di(1-naphthyl)-N,N'-diphenylbenzidine), TAPC(4,4'-Cyclohexylidene bis[N,N-bis(4-methylphenyl) benzenamine]), etc.

The electron transport region ETR is between the organic light emitting layer EML and the cathode CE. In the present exemplary embodiment, the electron transport region ETR has a structure in which an electron transport layer and an electron injection layer are stacked on one another. The election injection layer may be omitted from the electron transport region ETR in another embodiment.

The electron transport layer may include, but is not limited to, Alq3(Tris(8-hydroxyquinolinato)aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3, 4-oxadiazole), BAlq(Bis(2-methyl-8-quinolinolato-N1,O8)- (1,1'-Biphenyl-4-olato)aluminum), Bebq2(berylliumbis (benzoquinolin-10-olate), ADN(9,10-di(naphthalene-2-yl) anthracene), or a compound thereof.

In the present exemplary embodiment, the electron transport layer has a thickness of about 100 angstroms to about 1000 angstroms. In one embodiment, the electron transport layer has a thickness in a range of about 150 angstroms to about 500 angstroms. In the case where the thickness of the electron transport layer satisfies the above-mentioned thickness range, the electron transport property of the electron transport layer of the organic light emitting diode OLED may be improved without increasing the driving voltage.

The electron injection layer may include a lanthanide-based metal, e.g., LiF, LiQ (Lithium quinolate), Li2O, BaO, NaCl, CsF, Yb, etc., or a metal halide, e.g., RbCl, RbI, etc. For instance, according to another exemplary embodiment, the electron transport layer may include a mixture of an electron transport material and an organo metal salt with insulating property. The organo metal salt has an energy band gap of about 4 eV or more. For example, the organo metal salt may include metal acetate, metal benzoate, metal acetoacetate, metal acetylacetonate, or metal stearate.

In the present exemplary embodiment, the electron injection layer has a thickness of about 1 angstrom to about 100 angstroms. In one embodiment, the electron injection layer has a thickness in a range of about 3 angstroms to about 90 angstroms. When the thickness of the electron injection layer satisfies the above-mentioned thickness, the electron injection property of the organic light emitting diode OLED may be increased without increasing the driving voltage.

The second base substrate BS2 is coupled to the first base substrate BS1 having the organic light emitting diode OLED. A cover layer L4 is between the second base substrate BS2 and the first base substrate BS1. The cover layer L4 covers the organic light emitting diode OLED to prevent moisture and gases from entering into the organic light emitting diode OLED.

According another exemplary embodiment, the second base substrate BS2 may have a film shape in which an organic layer and an inorganic layer are alternately and repeatedly stacked on one another.

According to another exemplary embodiment, a color filter CF overlapping the organic light emitting layer EML is on the second base substrate BS2. Then, colored light emitted from the organic light emitting layer EML passes through the color filter CF. As a result, color characteristics of the colored light are improved.

In the present exemplary embodiment, the interlayer insulating layer L3 includes a first insulating layer SL1 and a second insulating layer SL2. The first insulating layer SL1 overlaps the organic light emitting diode OLED. The second insulating layer SL2 is defined as a portion of the interlayer insulating layer L3 corresponding to the non-light emission area NEA. The second insulating layer SL2 overlaps the auxiliary line AL in the non-light emission area NEA. In addition, the second insulating layer SL2 overlaps the second opening OP2 when viewed in a plan view and may be surrounded by connection electrode BE and the auxiliary line AL.

Figure 3A:
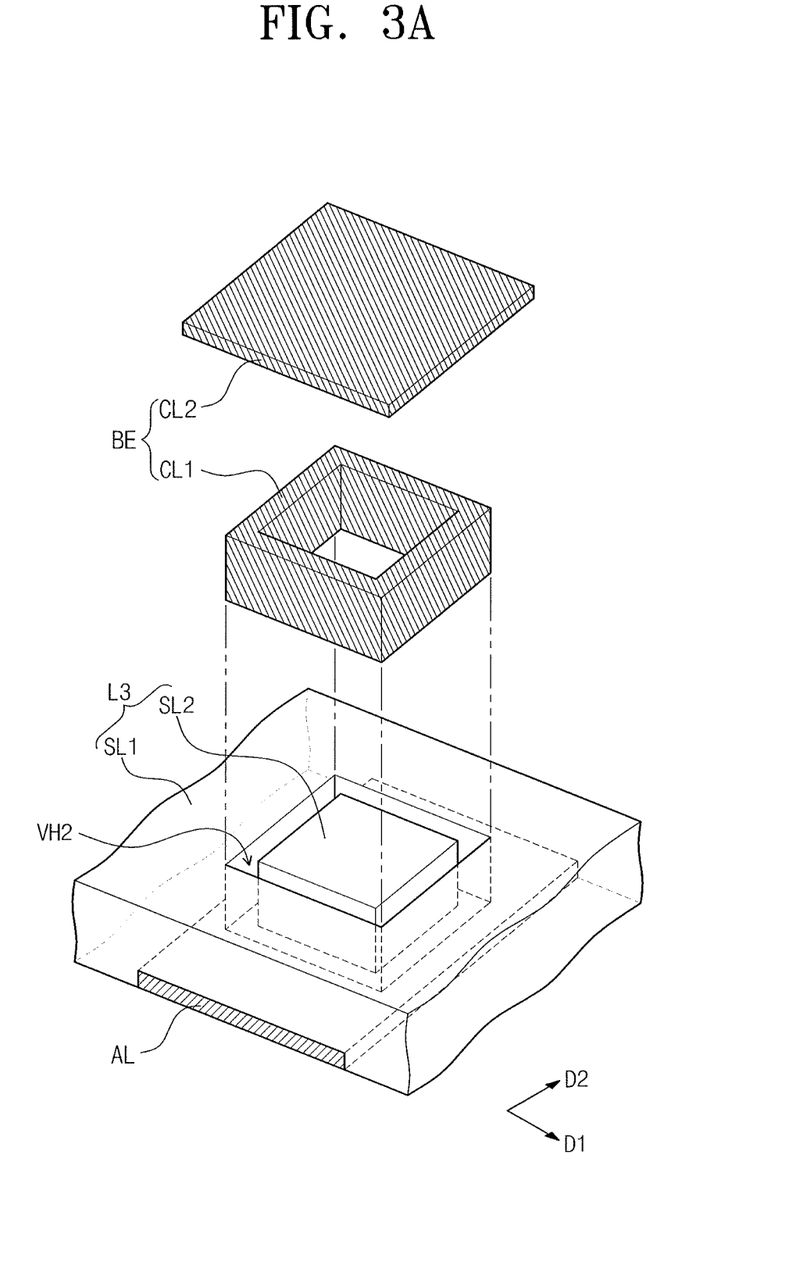
FIGS. 3A and 3B illustrates an embodiment of a connection between an auxiliary line and a connection electrode in FIG. 2.
Figure 3B:
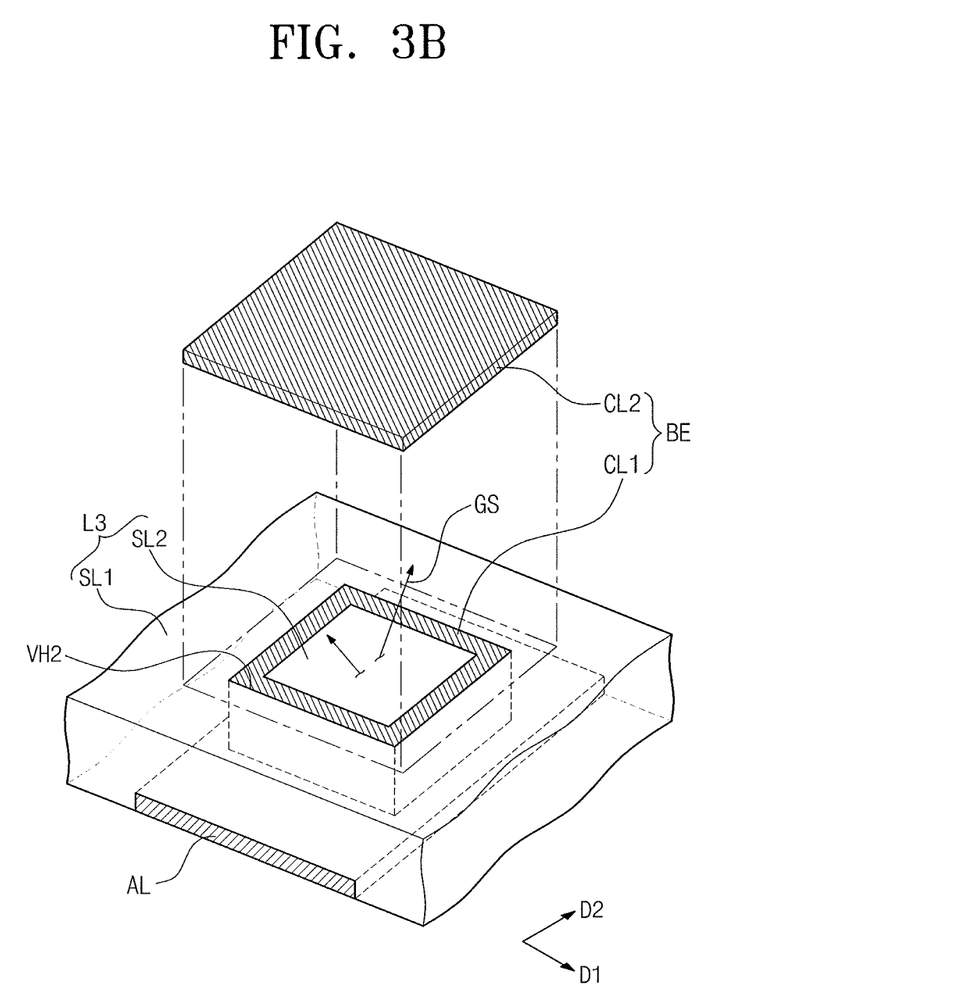

FIGS. 3A and 3B are exploded perspective views illustrating one embodiment of a connection structure between the auxiliary line and the connection electrode in FIG. 2. Referring to FIGS. 2, 3A, and 3B, the auxiliary line AL and the connection electrode BE overlap so that the interlayer insulating layer L3 is between the auxiliary line AL and the connection electrode BE in the non-light emission area NEA when viewed in a plan view. Also, the connection electrode BE is connected to the auxiliary line AL through the second via hole VH2 defined through the interlayer insulating layer L3.

The second insulating layer SL2 of the interlayer insulating layer L3 is spaced apart from the first insulating layer SL1 of the interlayer insulating layer L3, so that the second via hole VH2 is between the second insulating layer SL2 and the first insulating layer SL. Therefore, the second insulating layer SL2 may have an island shape isolated from the first insulating layer SL1.

The second via hole VH2 may have, for example, a quadrangular ring shape. The second insulating layer SL2 may have, for example, a quadrangular shape. According to another exemplary embodiment, the second via hole VH2 may have a polygonal ring shape and the second insulating layer SL2 may have a polygonal shape. These features may have different shapes in another embodiment.

The connection electrode BE includes a first conductive layer CL1 and a second conductive layer CL2. The first conductive layer CL1 is in the second via hole VH2. Thus the first conductive layer CL1 has the quadrangular ring shape that surrounds the second insulating layer SL2 when viewed in a plan view. The second conductive layer CL2 covers the first conductive layer CL1 and the second insulating layer SL2 and is connected to the first conductive layer CL1.

The first conductive layer CL1 covers a side portion of the second insulating layer SL2, the second conducive layer CL2 covers an upper portion of the second insulating layer SL2, and the auxiliary line AL covers a lower portion of the second insulating layer SL2. Since the size of the second conductive layer CL2 is greater than the second insulating layer SL2 when viewed in a plan view, an upper surface of the second insulating layer SL2 may be entirely covered by second conductive layer CL2.

When the auxiliary line AL, the second insulating layer SL2, and the connection electrode BE have the above-described structure, the second insulating layer SL2 may be sealed by the auxiliary line AL and the connection electrode BE. During fabrication, it is possible that gas GS may be generated from the second insulating layer SL2 when the second opening OP2 is formed through the organic light emitting layer EML using a laser beam LSR (refer, e.g., to FIG. 6B). The energy of the laser beam may be indirectly transmitted to the second insulating layer SL2 to generate the gas GS from the second insulating layer SL2. Even when this occurs, the gas GS may be blocked by the connection electrode BE and the auxiliary line AL and prevented from entering into the first insulating layer SL1.

Under some circumstances, when the second insulating layer SL2 is connected to the first insulting layer SL1, gas GS may enter into the first insulating layer SL1. Consequently, the gas GS may enter into the organic light emitting diode OLED on the first insulating layer SL1. However, according to the present exemplary embodiment, the path of the gas GS formed between the first and second insulating layers SL1 and SL2 may be blocked by the structure of the connection electrode BE and the auxiliary line AL. Thus, the organic light emitting diode OLED may be prevented from being deformed and the light emitting function of the organic light emitting diode OLED may be prevented from being deteriorated by the gas GS.

Figure 4:
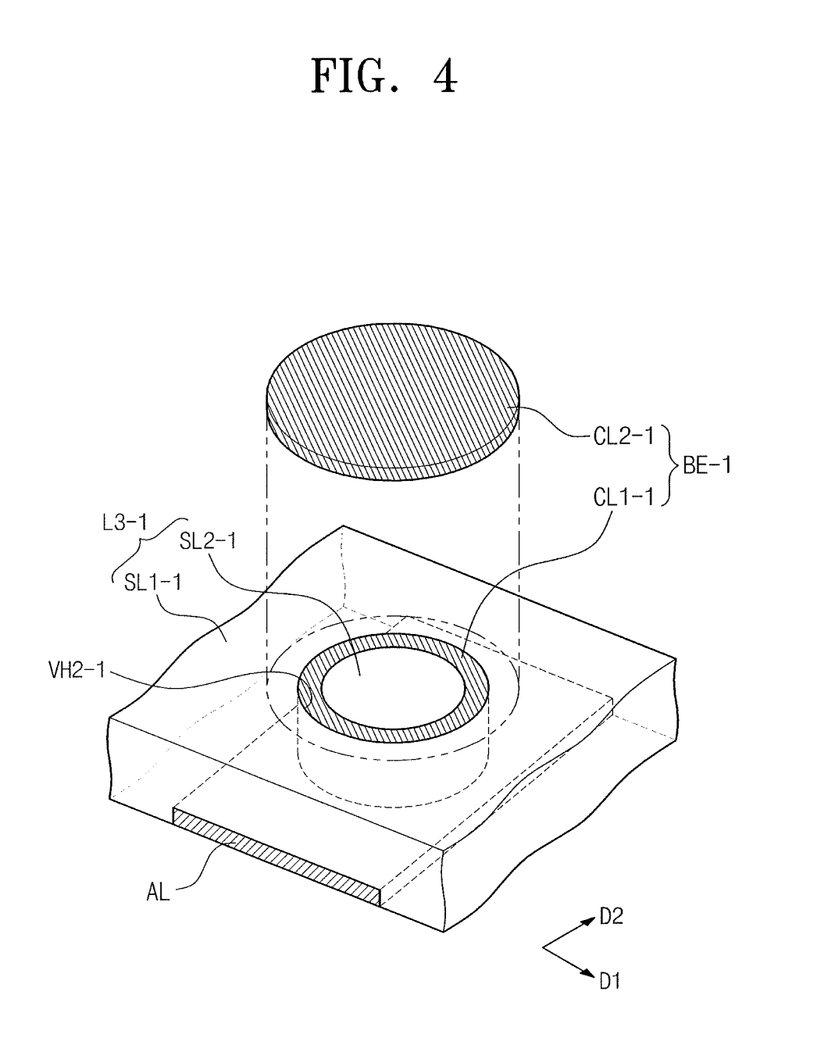
FIG. 4 illustrates another embodiment of a connection between an auxiliary line and a connection electrode.

FIG. 4 is an exploded perspective view illustrating another embodiment of a connection structure between an auxiliary line and a connection electrode. Referring to FIGS. 2 and 4, an auxiliary line AL overlaps a connection electrode BE-1 and an interlayer insulating layer L3-1 is between the auxiliary line AL and the connection electrode BE-1 in a non-light emission area NEA when viewed in a plan view. The connection electrode BE-1 may be connected to the auxiliary line AL through a second via hole VH2-1 formed through the interlayer insulating layer L3-1.

The connection electrode BE-1 includes a first conductive layer CL1-1 and a second conductive layer CL2-1. The interlayer insulating layer L3-1 includes a first insulating layer SL1-1 and a second insulating layer SL2-1.

In the present exemplary embodiment, the second via hole VH2-1 may have a circular ring shape, the second insulating layer SL2-1 may have a circular shape, and the second conductive layer CL2-1 may have a circular shape in a plan view.

Similar to the previous embodiment in FIGS. 3A and 3B, the second insulating layer SL2-1 is spaced apart from the first insulating layer SL1-1 and the second via hole VH2-1 is between the first and second insulating layers SL1-1 and SL2-1. Thus, the second insulating layer SL2-1 has an island shape isolated from the first insulating layer SL1-1.

The first conductive layer CL1-1 is accommodated in the second via hole VH2-1 and surrounds the second insulating layer SL2-1. The second conductive layer CL2-1 covers the first conductive layer CL1-1 and the second insulating layer SL2-1 and is connected to the first conductive layer CL1-1.

In the present exemplary embodiment, the first conductive layer CL1-1 covers a side portion of the second insulating layer SL2-1. The second conductive layer CL2-1 covers an upper portion of the second insulating layer SL2-1. The auxiliary line AL covers a lower portion of the second insulating layer SL2-1. Also, since the size of the second conductive layer CL2-1 is greater than the second insulating layer SL2-1 when viewed in a plan view, an upper surface of the second insulating layer LS2-1 may be entirely covered by the second conductive layer CL2-1.

Figure 5:
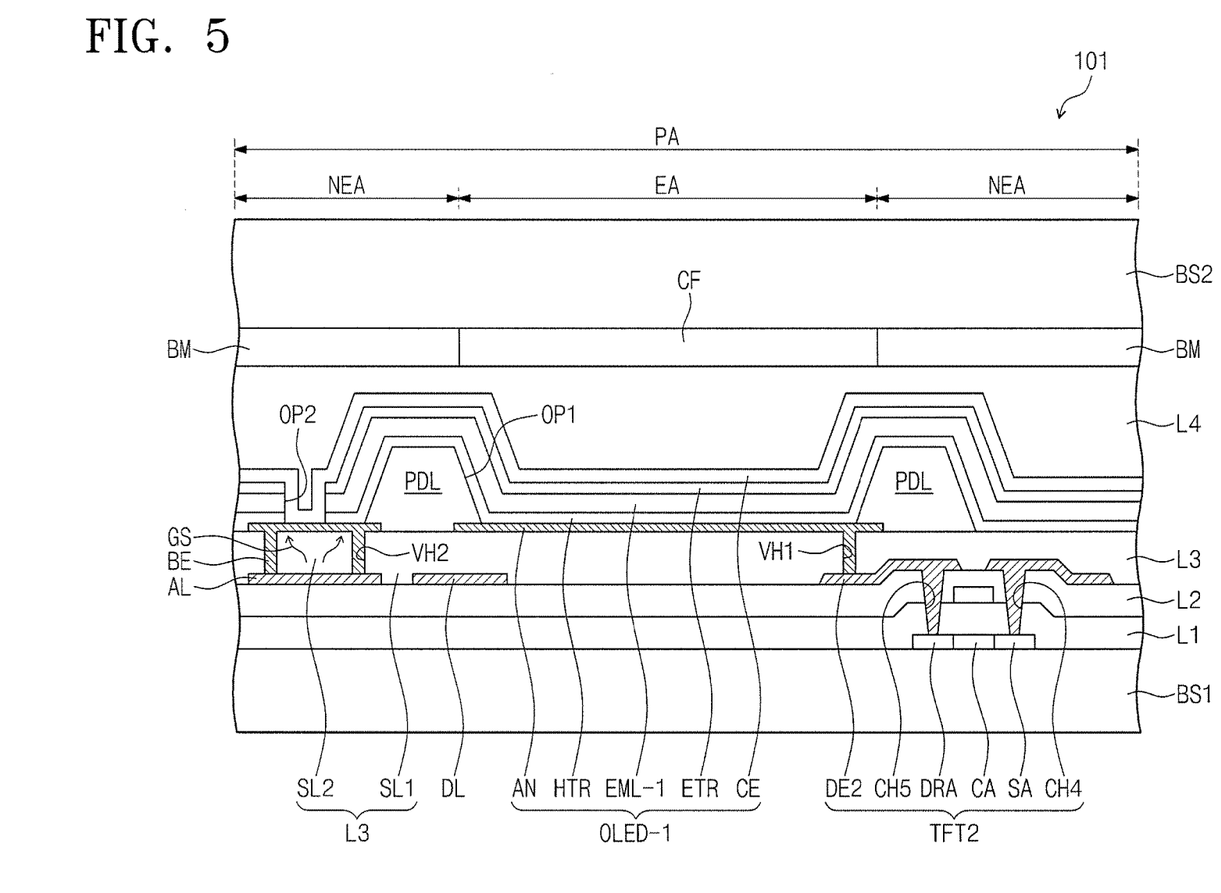
FIG. 5 illustrates another embodiment of an organic light emitting display.

FIG. 5 is a cross-sectional view illustrating an embodiment of an organic light emitting display 101 including one or more pixels. Referring to FIG. 5, the organic light emitting display 101 includes a first base substrate BS1, a second base substrate BS2, an auxiliary line AL, a driving transistor TFT2, an organic light emitting diode OLED-1, a color filter CF, and a light blocking layer BM.

The organic light emitting diode OLED-1 includes an anode AN, a hole transport region HTR, an organic light emitting layer EML-1, an electron transport region ETR, and a cathode CE. In the present exemplary embodiment, the organic light emitting layer EML-1 has a single-layer structure formed in a light emission area EA and a non-light emission area NEA, and the organic light emitting layer EML-1 generates a white light.

The color filter CF is on the second base substrate BS2 and corresponds to the light emission area EA. The light blocking layer BM is on the second base substrate BS2 and corresponds to the non-light emission area NEA. The color filter CF filters white light from the organic light emitting layer EML-1 to form color light. Thus, the color light is emitted from the light emission area EA by the combination of the organic light emitting layer EML-1 and the color filter CF.

Figure 6A:
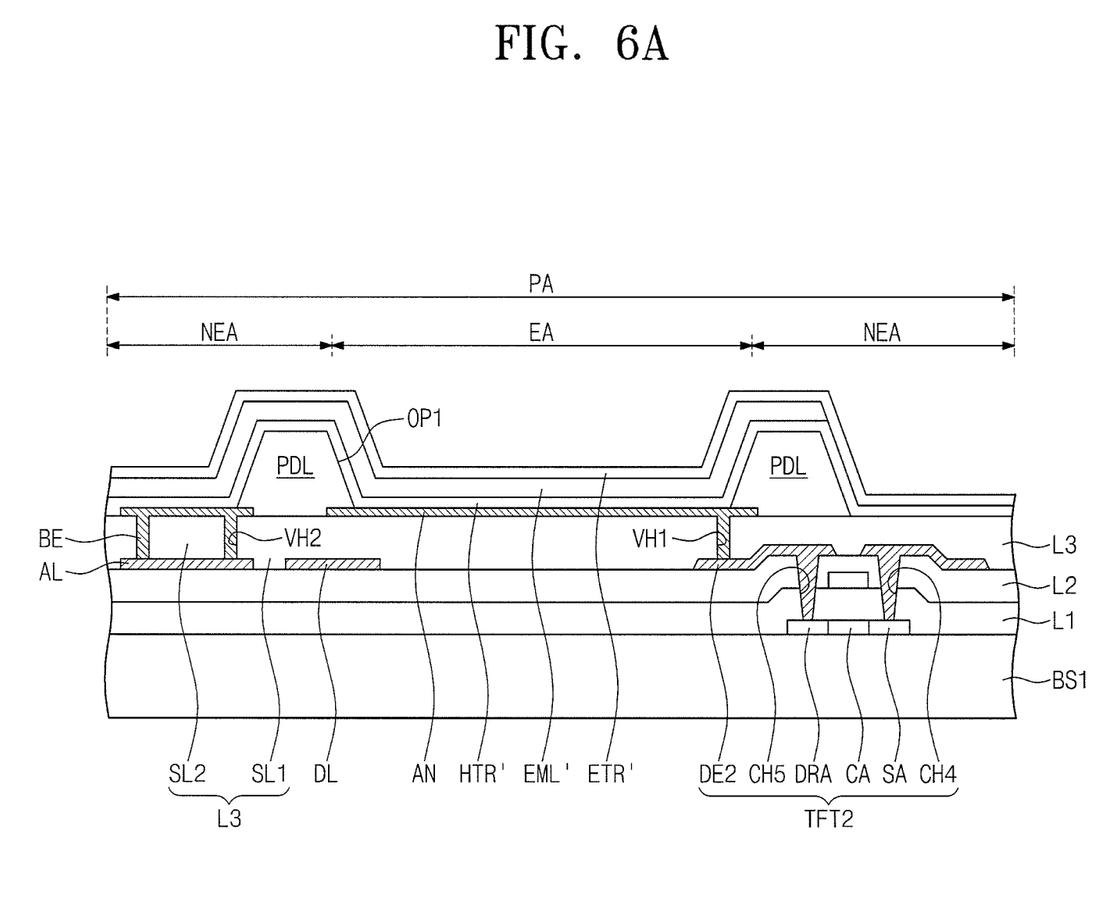
FIGS. 6A and 6B illustrate an embodiment of a method for forming an organic light emitting layer.
Figure 6B:
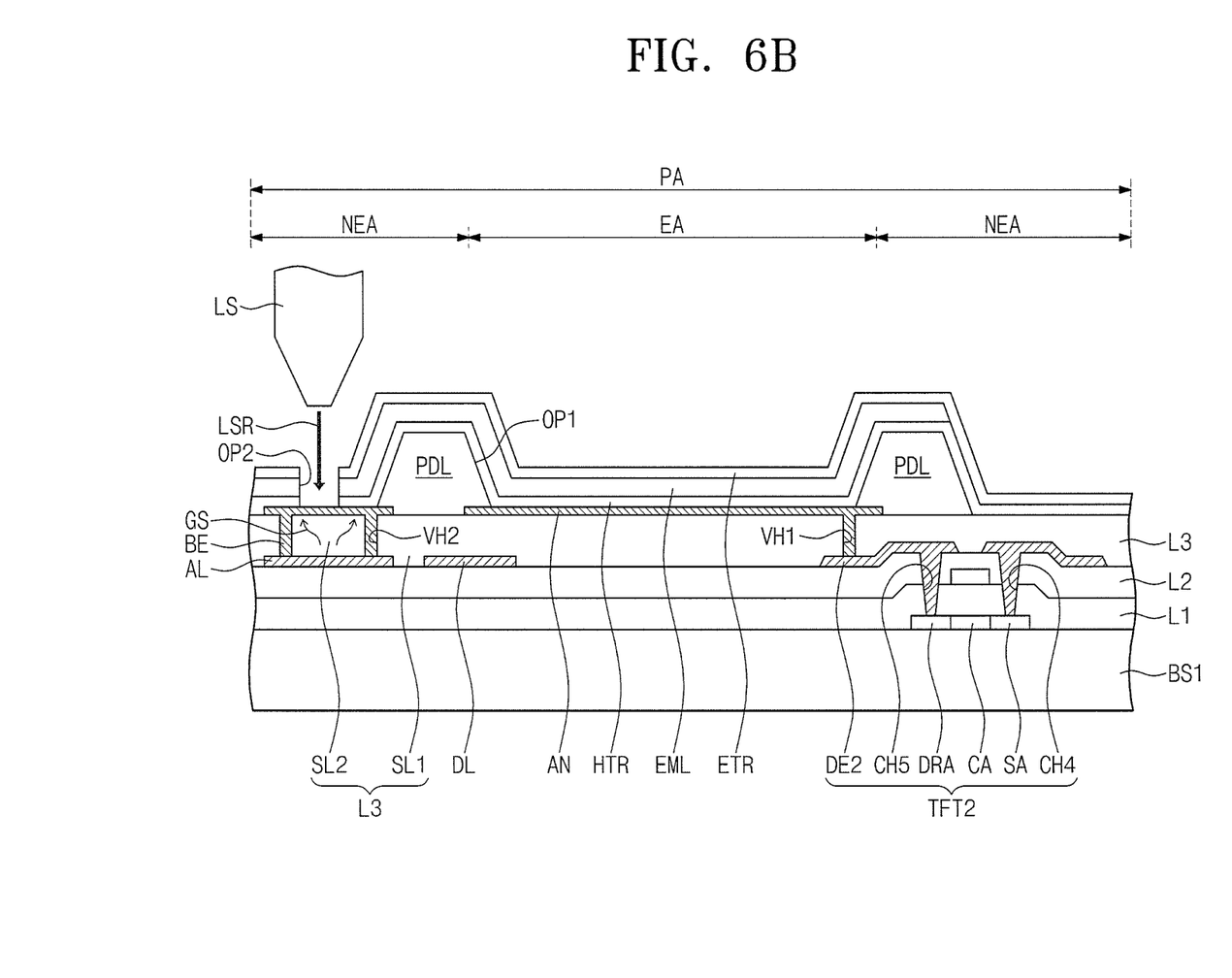

FIGS. 6A and 6B are cross-sectional views illustrating one embodiment of a method for forming an organic light emitting layer, such as, for example, illustrated in FIG. 2. Referring to FIG. 6A, the pixel definition layer PDL having the first opening OP1 defined therethrough is formed on the first base substrate BS1. Then, a preliminary hole transport region HTR', a preliminary organic light emitting layer EML', and a preliminary electron transport region ETR' are sequentially formed.

The preliminary organic light emitting layer EML' may be formed using, for example, small mask scanning (SMS). In this case, a patterned slit sheet scans the first base substrate BS1 to mask the first base substrate BS1 in time during which an organic material is deposited on the first base substrate BS1. Therefore, the preliminary organic light emitting layer EML', which is preliminarily patterned, is formed on the first base substrate BS1.

In the present exemplary embodiment, each of the preliminary hole transport region HTR' and the preliminary electron transport region ETR' is commonly formed over all or a predetermined number of pixels of the first base substrate BS1. Each of the preliminary hole transport region HTR' and the preliminary electron transport region ETR' may be formed, for example, using an open mask.

Referring to FIG. 6B, a laser system LS is positioned above the first base substrate BS1. The laser beam LSR is irradiated onto the preliminary hole transport region HTR', the preliminary organic light emitting layer EML', and the preliminary electron transport region ETR' (refer, e.g., to FIG. 6A) to form the second opening OP2, and the hole transport region HTR, the organic light emitting layer EML, and the electron transport region ETR are formed.

The energy of the laser beam LSR may be indirectly transmitted to the connection electrode BE and the second insulating layer SL2 of the interlayer insulating layer L3 in a time during which the second opening OP2 is formed using the laser beam LSR. Thus, gas GS may be generated from the second insulating layer SL2. However, as previously described with reference to FIG. 2, the gas GS may be blocked by the connection electrode BE and the auxiliary line AL and, thus, may be prevented from entering into the first insulating layer SL1 of the interlayer insulating layer L3. As a result, the light emitting function of the organic light emitting layer EML may be prevented from deteriorating and the shape of the organic light emitting diode OLED (refer, e.g., to FIG. 2) including the organic light emitting layer EML may be prevented from being deformed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display, comprising:
   a first base substrate including a light emission area and a non-light emission area;
   a driving transistor on the first base substrate;
   an interlayer insulating layer covering the driving transistor, and a first via hole and a second via hole defined in the interlayer insulating layer;
   an organic light emitting diode on the interlayer insulating layer and connected to the driving transistor, the organic light emitting diode at a location corresponding to the light emission area;
   an auxiliary line in the non-light emission area; and
   a connection electrode on the interlayer insulating layer and connected to the auxiliary line through the second via hole, the connection electrode surrounding a portion of the interlayer insulating layer corresponding to the non-light emission area together with the auxiliary line, wherein a portion of the interlayer insulating layer is within a closed space defined by the connection electrode and the auxiliary line, and wherein the organic light emitting diode includes an anode connected to the driving transistor through the first via hole, an organic light emitting layer on the anode, and a cathode on the organic light emitting layer and connected to the auxiliary line through the connection electrode.

2. The display as claimed in claim 1, wherein the connection electrode and the auxiliary line seal a portion of the interlayer insulating layer corresponding to the non-light emission area.

3. The display as claimed in claim 1, wherein the interlayer insulating layer includes:
   a first insulating layer overlapping the organic light emitting diode; and
   a second insulating layer overlapping the auxiliary line in the non-light emission area and spaced apart from the first insulating layer, wherein the connection electrode is between the first insulating layer and the second insulating layer.

4. The display as claimed in claim 3, wherein the connection electrode includes:
   a first conductive layer in the second via hole and surrounding the second insulating layer; and
   a second conductive layer connected to the first conductive layer and covering the first conductive layer and the second insulating layer.

5. The display as claimed in claim 4, wherein a size of the second conductive layer is greater than a size of the second insulating layer.

6. The display as claimed in claim 4, wherein:
   the first conductive layer has a ring shape, and
   the second conductive layer has a polygonal shape.

7. The display as claimed in claim 4, wherein:
   the first conductive layer has a ring shape, and
   the second conductive layer has a circular shape.

8. The display as claimed in claim 4, wherein:
   the first conductive layer covers a side portion of the second insulating layer,
   the second conductive layer covers an upper portion of the second insulating layer, and
   the auxiliary line covers a lower portion of the second insulating layer.

9. The display as claimed in claim 3, wherein:
   an opening is defined in the organic light emitting layer corresponding to the non-light emission area, the opening overlapping the second insulating layer.

10. The display as claimed in claim 1, further comprising:
    a gate insulating layer on the first base substrate; and
    an intermediate insulating layer between the gate insulating layer and the interlayer insulating layer, wherein the driving transistor includes:
    a semiconductor pattern;
    a gate electrode overlapping the semiconductor pattern, the gate insulating layer interposed between the gate electrode and the semiconductor pattern;
    a source electrode on the intermediate insulating layer and connected to the semiconductor pattern; and
    a drain electrode on the intermediate insulating layer, connected to the semiconductor pattern, and connected to the anode through the first via hole, wherein the auxiliary line is on the intermediate insulating layer.

11. The display as claimed in claim 10, wherein the auxiliary line, the source electrode, and the drain electrode include a same material.

12. The display as claimed in claim 10, wherein the connection electrode and the anode include a same material.

13. The display as claimed in claim 1, wherein the cathode has a light transmissive property.

14. The display as claimed in claim 1, wherein the organic light emitting layer emits color light.

15. The display as claimed in claim 1, further comprising:
    a second base substrate facing the first base substrate; and
    a color filter on the second base substrate and corresponding to the light emission area, wherein the organic light emitting layer emits white light.

16. An organic light emitting display, comprising:
    a base substrate including a light emission area and a non-light emission area;
    a driving transistor on the base substrate;

an interlayer insulating layer covering the driving transistor, and a first via hole and a second via hole defined in the interlayer insulating layer;

an organic light emitting diode on the interlayer insulating layer and corresponding to the light emission area, the organic light emitting diode connected to the driving transistor;

an auxiliary line in the non-light emission area; and a connection electrode on the interlayer insulating layer and connecting the organic light emitting diode to the auxiliary line through the second via hole, wherein the interlayer insulating layer includes:

a first insulating layer overlapping the organic light emitting diode; and a second insulating layer overlapping the auxiliary line in the non-light emission area and having an island shape isolated from the first insulating layer, the second insulating layer disposed within a closed space defined by the connection electrode and the auxiliary line.

17. The display as claimed in claim 16, wherein the connection electrode includes:

a first conductive layer in the second via hole and surrounding the second insulating layer; and a second conductive layer connected to the first conductive layer and covering the first conductive layer and the second insulating layer.

18. The display as claimed in claim 17, wherein the first conductive layer, the second conductive layer, and the auxiliary line seal the second insulating layer.

19. The display as claimed in claim 17, wherein:

the first conductive layer covers a side portion of the second insulating layer, the second conductive layer covers an upper portion of the second insulating layer, and the auxiliary line covers a lower portion of the second insulating layer.

\* \* \* \* \*